(12) United States Patent
Rodder et al.

(10) Patent No.: US 10,964,698 B2
(45) Date of Patent: *Mar. 30, 2021

(54) FIELD EFFECT TRANSISTOR WITH DECOUPLED CHANNEL AND METHODS OF MANUFACTURING THE SAME

(71) Applicant: Samsung Electronics Co., Ltd., Suwon-si (KR)

(72) Inventors: Mark S. Rodder, Dallas, TX (US); Borna J. Obradovic, Leander, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/879,586

(22) Filed: May 20, 2020

(65) Prior Publication Data

US 2020/0279849 A1    Sep. 3, 2020

Related U.S. Application Data

(63) Continuation of application No. 16/227,701, filed on Dec. 20, 2018, now Pat. No. 10,700,068, which is a
(Continued)

(51) Int. Cl.
*H01L 29/00* (2006.01)
*H01L 27/092* (2006.01)
(Continued)

(52) U.S. Cl.
CPC .. *H01L 27/0924* (2013.01); *H01L 21/823821* (2013.01); *H01L 21/845* (2013.01);
(Continued)

(58) Field of Classification Search
CPC ......... H01L 21/823821; H01L 27/0886; H01L 29/66795
See application file for complete search history.

(56) References Cited

U.S. PATENT DOCUMENTS 9,166,023 B2    10/2015    Loubet et al.
9,166,049 B2    10/2015    Loubet et al.
(Continued)

FOREIGN PATENT DOCUMENTS

CN    104392917 A    3/2015
CN    105518848 A    4/2016
CN    107978630 A    5/2018

OTHER PUBLICATIONS

Chinese Intellectual Property Second Office Action for corresponding Chinese Patent Application No. 201711320246.7, dated Sep. 14, 2020, 6 pages.
(Continued)

*Primary Examiner* — Nicholas J Tobergte
(74) *Attorney, Agent, or Firm* — Lewis Roca Rothgerber Christie LLP

(57) ABSTRACT

A field effect transistor (FET) for an nFET and/or a pFET device including a substrate and a fin including at least one channel region decoupled from the substrate. The FET also includes a source electrode and a drain electrode on opposite sides of the fin, and a gate stack extending along a pair of sidewalls of the channel region of the fin. The gate stack includes a gate dielectric layer and a metal layer on the gate dielectric layer. The FET also includes an oxide separation region separating the channel region of the fin from the substrate. The oxide separation region includes a dielectric material that includes a portion of the gate dielectric layer of the gate stack. The oxide separation region extends completely from a surface of the channel region facing the substrate to a surface of the substrate facing the channel region.

20 Claims, 5 Drawing Sheets

Related U.S. Application Data continuation of application No. 15/485,188, filed on Apr. 11, 2017, now Pat. No. 10,199,474.

(60) Provisional application No. 62/433,166, filed on Dec. 12, 2016.

(51) Int. Cl.

| | |
|---|---|
| *H01L 29/06* | (2006.01) |
| *H01L 29/78* | (2006.01) |
| *H01L 21/8238* | (2006.01) |
| *H01L 29/04* | (2006.01) |
| *H01L 21/84* | (2006.01) |
| *H01L 29/10* | (2006.01) |
| *H01L 27/12* | (2006.01) |
| *H01L 29/66* | (2006.01) |

(52) U.S. Cl.
CPC ...... *H01L 27/1203* (2013.01); *H01L 27/1211* (2013.01); *H01L 29/045* (2013.01); *H01L 29/0673* (2013.01); *H01L 29/1054* (2013.01); *H01L 29/66795* (2013.01); *H01L 29/785* (2013.01); *H01L 29/7843* (2013.01); *H01L 21/823807* (2013.01); *H01L 29/6653* (2013.01); *H01L 29/66545* (2013.01); *H01L 29/66553* (2013.01)

(56) References Cited

U.S. PATENT DOCUMENTS

| | | |
|---|---|---|
| 9,276,117 B1 | 3/2016 | Lee et al. |
| 9,293,324 B2 | 3/2016 | Bentley et al. |
| 9,343,550 B2 | 5/2016 | Cheng et al. |
| 9,406,783 B2 | 8/2016 | Morin et al. |
| 9,472,613 B2 | 10/2016 | Cappellani et al. |
| 10,199,474 B2 * | 2/2019 | Rodder ............... H01L 29/1054 |
| 2007/0231997 A1 | 10/2007 | Doyle et al. |
| 2015/0076561 A1 | 3/2015 | Cheng et al. |
| 2015/0325436 A1 | 11/2015 | Bentley et al. |
| 2016/0190239 A1 | 6/2016 | Suk et al. |
| 2016/0308055 A1 | 10/2016 | Obradovic et al. |
| 2018/0114863 A1 | 4/2018 | Bao et al. |
| 2018/0122710 A1 | 5/2018 | Cheng et al. |
| 2018/0122952 A1 | 5/2018 | Bao et al. |

OTHER PUBLICATIONS

Bidal, G., et al. "Planar Bulk+ Technology using TiN/Hf-based gate stack for Low Power Applications", IEEE, 2008 (pp. 146-147).
Final Office Action issued in U.S. Appl. No. 16/227,701 by the USPTO, dated Oct. 2, 2019, 6 pages.
Jurczak, Malgorzata et al., "Silicon-on-Nothing (SON)—An Innovative Process for Advanced CMOS," IEEE Transactions on Electron Devices, vol. 47, No. 11, 2000, 9 pages.
Monfray, S., et al., "First 80 nm SON (Silicon-On-Nothing) MOSFETs with perfect morphology and high electrical performance", IEEE, 2001 (4 pages).
Notice of Allowance issued in U.S. Appl. No. 15/485,188 by the USPTO, dated Sep. 20, 2018, 10 pages.
Zheng, Peng et al., "Simulation-Based Study of the Inserted-Oxide FinFET for Future Low-Power System-on-Chip Applications," IEEE Electron Device Letters, vol. 36, No. 8, 2015, 3 pages.

\* cited by examiner

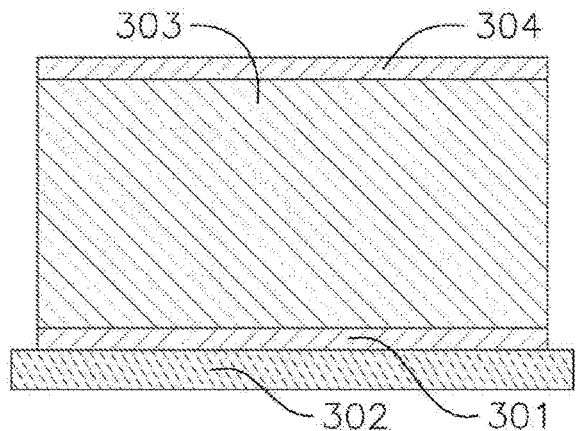
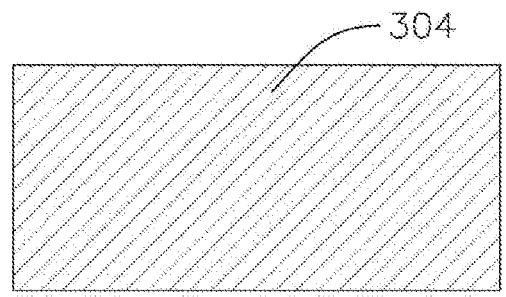
FIG. 4A
FIG. 4B
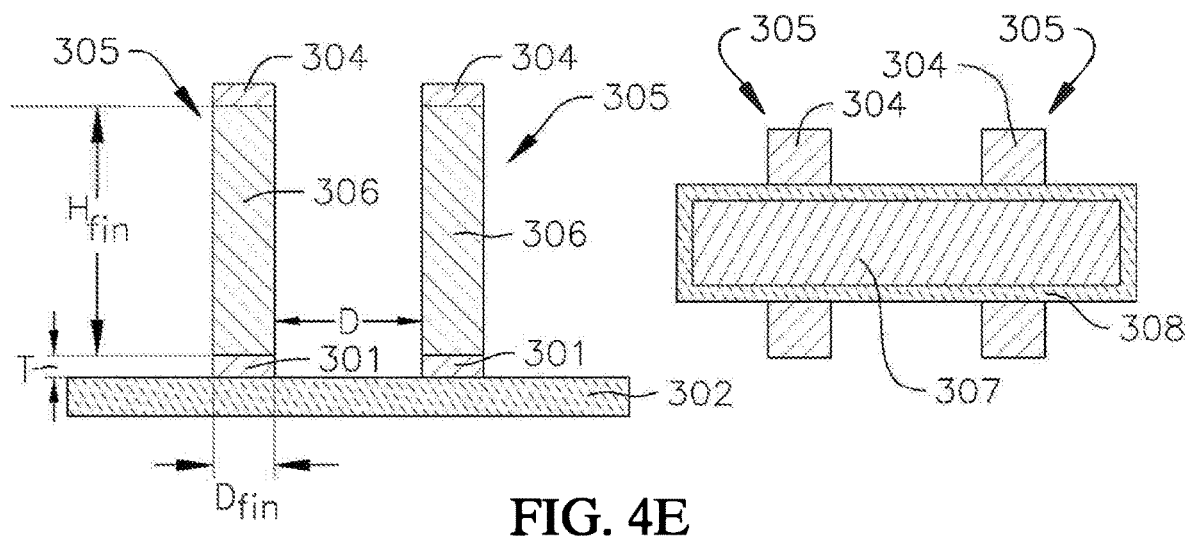
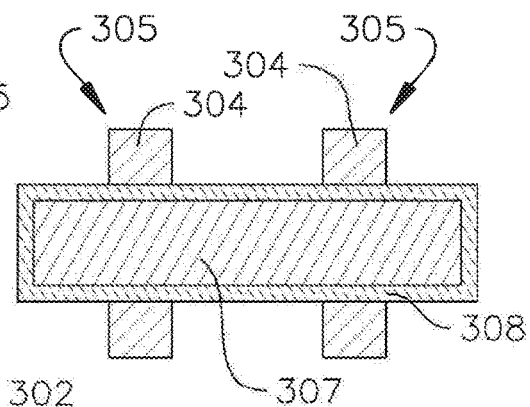
FIG. 4C
FIG. 4D
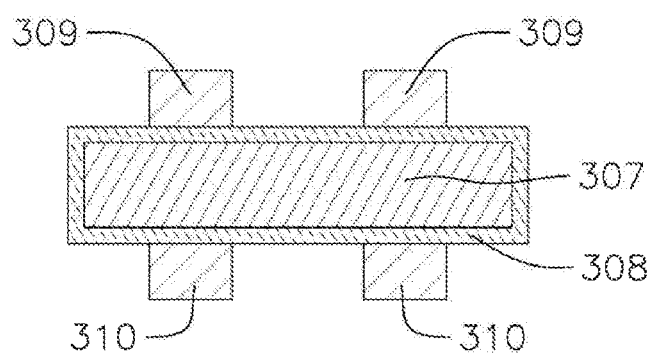
FIG. 4E

FIELD EFFECT TRANSISTOR WITH DECOUPLED CHANNEL AND METHODS OF MANUFACTURING THE SAME

CROSS-REFERENCE TO RELATED APPLICATION

This application is a continuation of U.S. patent application Ser. No. 16/227,701, filed Dec. 20, 2018, which is a continuation of U.S. patent application Ser. No. 15/485,188 (now U.S. Pat. No. 10,199,474), filed Apr. 11, 2017, which claims priority to and the benefit of U.S. Provisional Patent Application No. 62/433,166, filed Dec. 12, 2016, entitled "Enhanced Fin-Like FET Formed by a Decoupling Technique with Simple Manufacturing Flow," the entire contents of each of which are incorporated herein by reference.

FIELD

The present disclosure relates generally to field effect transistors and methods of manufacturing field effect transistors.

BACKGROUND

Conventional circuits are commonly formed from non-planar "fin" field effect transistors (finFETs). Conventional finFETs generally include multiple vertical fins serving as conducting channel regions. Conventional finFETs are not a gate-all-around (GAA) structure, and therefore gate control is only on sides of the fins, which limits gate length scaling.

Future technologies have contemplated inserting dielectric separation regions into the conducting channel region to divide or separate the fin into a series of stacked nanowire-like channel regions. These dielectric separation regions improve scaling of gate length by improving control of the channel potential compared to a conventional finFET without the dielectric separation regions. Improved channel control of the channel potential results from the gate coupling to each nanowire-like channel region through the dielectric separation regions at the top and bottom of each nanowire-like channel region in addition to the gate coupling to each nanowire-like channel region through the gate dielectric layers along the sides of each nanowire-like channel region. Additionally, the dielectric separation regions between portions of the fin increase the effective current drive per normalized height of the vertical sidewall conducting surfaces of the fin.

However, these dielectric separation regions between portions of the fin reduce the total height (i.e., summed height of each nanowire-like channel region) of the vertical sidewall conducting surfaces of the fin compared to a conventional finFET without the dielectric separation regions having the same total non-normalized structural height. Reducing the total height of the sidewall conducting surfaces may reduce the total current drive in the fin. Accordingly, inserting dielectric separation regions into the fin to create a series of stacked nanowire-like channel regions may result in a tradeoff between improving the scaling of gate length and reducing the total current drive per total non-normalized structural height.

SUMMARY

The present disclosure is directed to various embodiments of a field effect transistor (FET) for an nFET and/or a pFET device. In one embodiment, the FET includes a substrate, a fin including at least one channel region decoupled from the substrate, source and drain electrodes on opposite sides of the fin, and a gate stack extending along a pair of sidewalls of the at least one channel region of the fin. The gate stack includes a gate dielectric layer and a metal layer on the gate dielectric layer. The FET also includes an oxide separation region separating the at least one channel region of the fin from the substrate. The oxide separation region includes a dielectric material and the dielectric material of the oxide separation region includes a portion of the gate dielectric layer of the gate stack. The oxide separation region extends completely from a surface of the channel region facing the substrate to a surface of the substrate facing the channel region.

The channel region may have a channel width from approximately 4 nm to approximately 10 nm, and the channel region may have a channel height from approximately 20 nm to approximately 80 nm.

The channel region may have a channel width from approximately 4 nm to approximately 7 nm, and the channel region may have a channel height from approximately 40 nm to approximately 80 nm.

The channel region may have a channel width from approximately 5 nm to approximately 6 nm, and the channel region may have a channel height from approximately 45 nm to approximately 55 nm.

The channel region may have a channel width from approximately 8 nm to approximately 30 nm, and the channel region may have a channel height from approximately 5 nm to approximately 20 nm.

The channel region may have a channel width from approximately 15 nm to approximately 30 nm, and the channel region may have a channel height from approximately 5 nm to approximately 15 nm.

The oxide separation region may have a thickness from approximately 1 nm to approximately 5 nm.

The oxide separation region may not extend under the source electrode or the drain electrode.

The at least one channel region may be strained.

The fin may include a single channel region.

The present disclosure is also directed to various methods of manufacturing a field effect transistor (FET) for an nFET and/or pFET device. In one embodiment, the method includes forming a stack on a substrate. The stack includes a first sacrificial layer on the substrate and a conducting channel layer on the first sacrificial layer. The method also includes etching the stack to form at least one fin including at least one conducting channel region, forming a source electrode on a first side of the at least one fin, forming a drain electrode on a second side of the at least one fin opposite to the first side. The method further includes removing a remainder of the first sacrificial layer between the at least one conducting channel region and the substrate, and forming an oxide separation region including a dielectric material. The oxide separation region completely fills in a region previously occupied by the remainder of the first sacrificial layer. The method also includes forming a gate stack including a gate dielectric layer and a metal layer on the gate dielectric layer. The gate stack extends along a pair of sidewalls of the at least one conducting channel region.

Forming the stack may include forming a second sacrificial layer on the conducting channel layer and a second conducting channel layer on the second sacrificial layer.

Etching the stack may include forming the at least one fin including a first conducting channel region and a second conducting channel region stacked on the first conducting channel region.

The method may also include forming a second oxide separation region. The second oxide separation region extends between the first conducting channel region and the second conducting channel region.

The oxide separation region may have a thickness from approximately 1 nm to approximately 5 nm.

Forming the oxide separation region may not form any portion of the oxide separation region under the source electrode or the drain electrode.

The at least one conducting channel region may have a channel width from approximately 4 nm to approximately 10 nm, and the at least one conducting channel region may have a channel height from approximately 20 nm to approximately 80 nm.

The at least one conducting channel region may have a channel width from approximately 8 nm to approximately 30 nm, and the at least one conducting channel region may have a channel height from approximately 5 nm to approximately 20 nm.

The conducting channel layer may include Si and the first sacrificial layer may include SiGe. The Ge content of the SiGe may be from approximately 10% to approximately 50%.

The method may include forming an external spacer on the at least one fin. The oxide separation region may extend to a lateral extent under the external spacer.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 4A-4B depict a schematic cross-sectional view and a schematic top view, respectively, of a task of a method of forming a FET according to one embodiment of the present disclosure;

FIGS. 4C-4D depict a schematic cross-sectional view and a schematic top view, respectively, of another task of the method of forming the FET according to one embodiment of the present disclosure;

FIG. 4E depicts a schematic top view of a further task of the method of forming the FET according to one embodiment of the present disclosure;

DETAILED DESCRIPTION

Figure 1A:
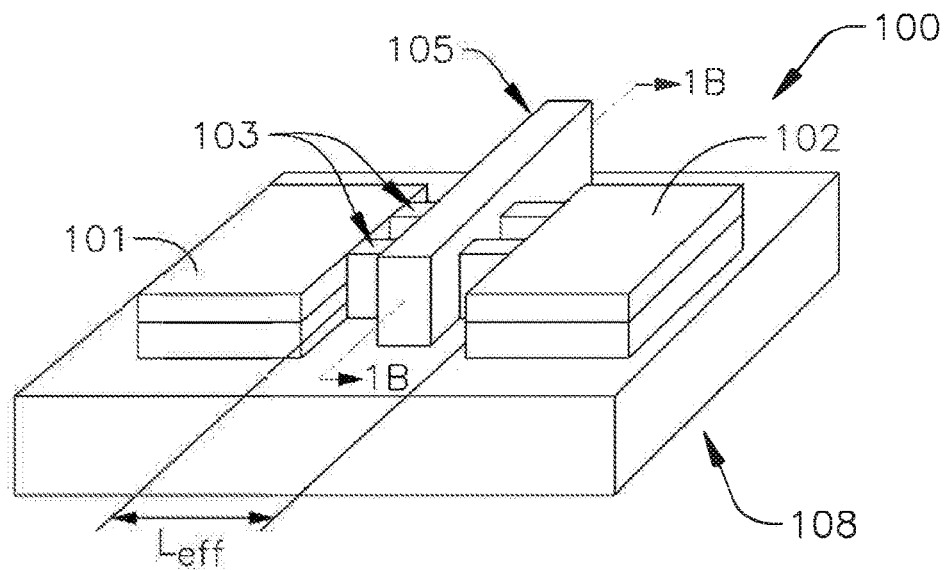
FIGS. 1A-1B are a schematic perspective view and a schematic cross-sectional view, respectively, of a field effect transistor (FET) according to one embodiment of the present disclosure.

The present disclosure is directed to various embodiments of a field effect transistor (FET) and methods of manufacturing the same. The FETs of the present disclosure include a fin having at least one channel region separated (e.g., decoupled) from a substrate by an oxide separation layer, and a gate stack including a gate dielectric layer and a metal layer. According to one or more embodiments of the present disclosure, the dielectric layer of the gate stack extends completely around the channel region, whereas the metal layer of the gate stack extends along an upper surface and sides of the channel region, but does not extend between the channel region and the substrate or between adjacent channel regions when two or more channel regions are provided. Accordingly, the FETs of the present disclosure are partial gate-all-around (partial-GAA) fin-like FETs.

Separating (e.g., decoupling) the channel region of the fin from the substrate with the oxide separation layer is configured to increase the effective strain in the channel region from source and drain stressor regions compared to conventional finFETs. Separating the channel region from the substrate with the oxide separation layer is also configured to increase the capacitive coupling from the substrate to the channel region compared to conventional finFETs. Separating (e.g., decoupling) the channel region from the substrate with the oxide separation layer is further configured to increase the capacitive coupling of the gate to the substrate (e.g., the bulk-silicon substrate) compared to conventional finFETs, which can, for example, reduce an undesired leakage current that may flow in the substrate (e.g., the bulk-silicon substrate).

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
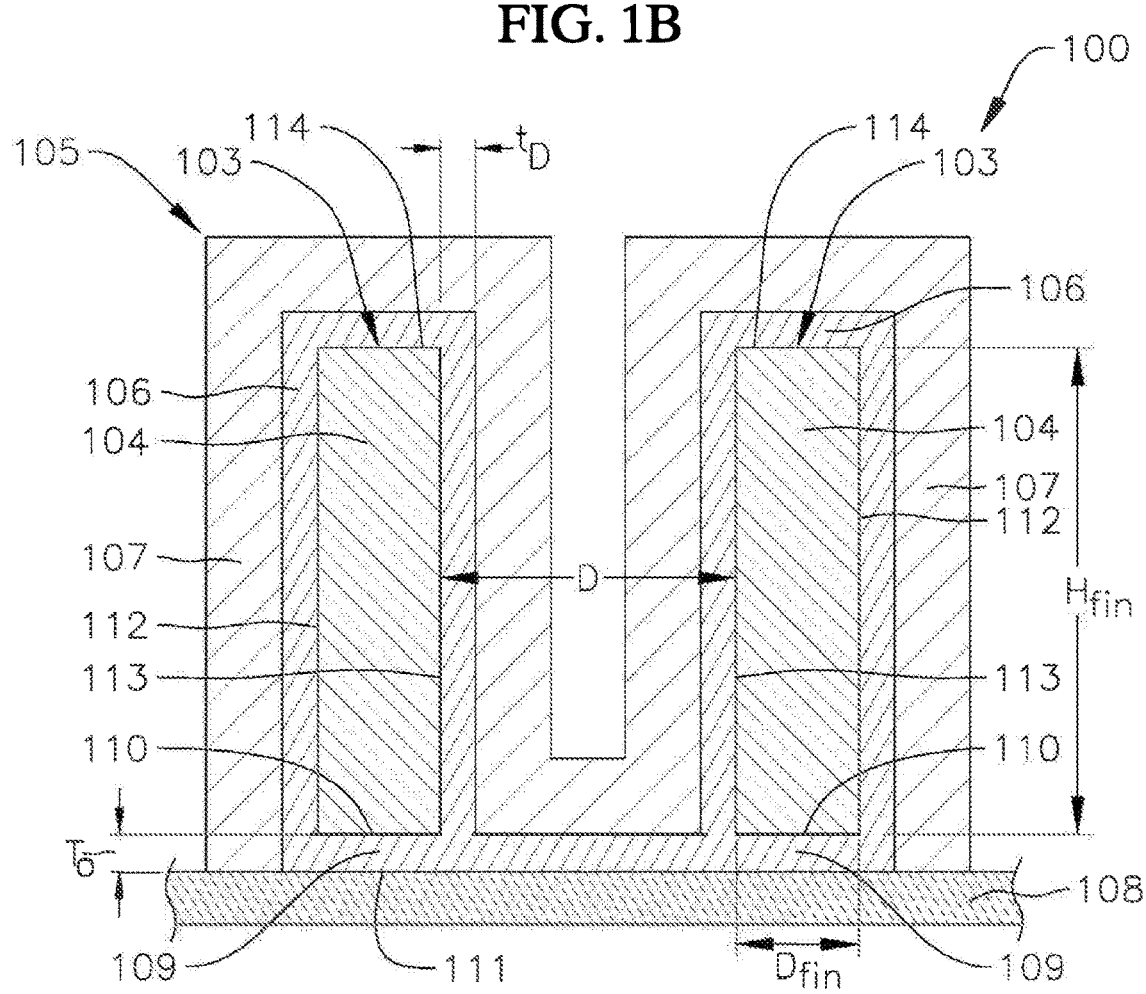

With reference now to FIGS. 1A-1B, a field effect transistor (FET) 100 according to one embodiment of the present disclosure includes a source electrode 101, a drain electrode 102, at least one fin 103 having a channel region 104 extending between the source and drain electrodes 101, 102, and a gate stack 105 including a gate dielectric layer 106 and a metal layer 107 on the gate dielectric layer 106. The source and drain electrodes 101, 102, the fin 103, and the gate stack 105 are formed on a substrate 108 (e.g., a bulk-silicon substrate or a silicon-on-insulator (SOI) substrate).

In the illustrated embodiment, the FET 100 also includes an oxide separation region or layer 109 separating (e.g., decoupling) the channel region 104 of the fin 103 from the substrate 108. The oxide separation layer 109 extends between a surface 110 of the channel region 104 facing the substrate 108 (e.g., a lowermost surface of the channel region 104) and a surface 111 (e.g., an upper surface) of the substrate 108. In one or more embodiments, the oxide separation layer 109 includes a dielectric material. In one or more embodiments, the dielectric material of the oxide separation layer 109 may be a portion of the dielectric layer 106 of the gate stack 105. In one or more embodiments, the oxide separation layer 109 may have a thickness $t_O$ from approximately 1 nm to approximately 5 nm. In one or more embodiments, the oxide separation layer 109 may have a thickness $t_O$ from approximately 2 nm to approximately 3 nm.

Separating (e.g., decoupling) the channel region 104 of the fin 103 from the substrate 108 with the oxide separation layer 109 is configured to increase the effective strain in the channel region 104 from stressor regions of the source and drain electrodes 101, 102 (i.e., the effective strain in the channel region 104 of the FET 100 according to one embodiment of the present disclosure is greater than that in conventional finFETs because the channel region 104 is not pinned to the substrate 108 due to the presence of the oxide separation layer 109 between the channel region 104 and the substrate 108). Separating the channel region 104 from the substrate 108 with the oxide separation layer 109 is also configured to increase the capacitive coupling from the substrate 108 to the channel region 104 compared to conventional finFETs. Separating the channel region 104 from the substrate 108 with the oxide separation layer 109 is further configured to increase the capacitive coupling from the gate stack 105 to the channel region 104 compared to conventional finFETs.

In the illustrated embodiment, the gate dielectric layer 106 extends along a pair of opposing sidewalls or side surfaces 112, 113 of channel region 104 and along an upper surface 114 of the channel region 104. Together, the gate dielectric layer 106 and the oxide separation layer 109 extend completely around the channel region 104 of the fin 103. Additionally, in the illustrated embodiment, the metal layer 107 of the gate stack 104 extends along portions of the gate dielectric layer 106 that extend along the side surfaces 112, 113 of the channel region 104. The metal layer 107 also extends along a portion of the gate dielectric layer 106 that extends along the upper surface 114 of the channel region 104 (i.e., the metal layer 107 extends around or covers the channel region 104 of the fin 103) but the metal layer 107 does not extend between the channel region 104 and the substrate 108. Accordingly, in the illustrated embodiment, the full gate stack 105 (i.e., the gate dielectric layer 106 and the metal layer 107) does not extend fully or completely around the channel region 104 such that the FET 100 of the present disclosure is a partial gate-all-around (partial-GAA) FET rather than a full GAA FET.

In one or more embodiments, the metal layer 107 of the gate stack 105 may include a work-function tuning metal layer. In one or more embodiments, the metal layer 107 of the gate stack 105 may include a low-resistance metal cladding layer adjacent to the work-function tuning metal layer. In one or more embodiments, the work-function tuning metal layer of the metal layer 107 may have a thickness from approximately 1 nm to approximately 5 nm. In one or more embodiments, the gate dielectric layer 106 of the gate stack 105 may have a thickness $t_D$ from approximately 1 nm to approximately 3 nm. Additionally, in one or more embodiments, the thickness $t_O$ of the oxide separation layer 109 may be different than the thickness $t_D$ of the gate dielectric layer 106 extending along the sidewalls 112, 113 (e.g., the thickness $t_O$ of the dielectric material extending between the lower surface 110 of the channel region 104 and the upper surface 111 of the substrate 108 may be different than the thickness $t_D$ of the dielectric material extending along the sidewalls 112, 113 of the channel region 104). In one or more embodiments, the thickness $t_O$ of the oxide separation layer 109 may be the same or less than twice the thickness $t_D$ of the gate dielectric layer 106 extending along the sidewalls 112, 113 of the channel region 104.

Figure 2:
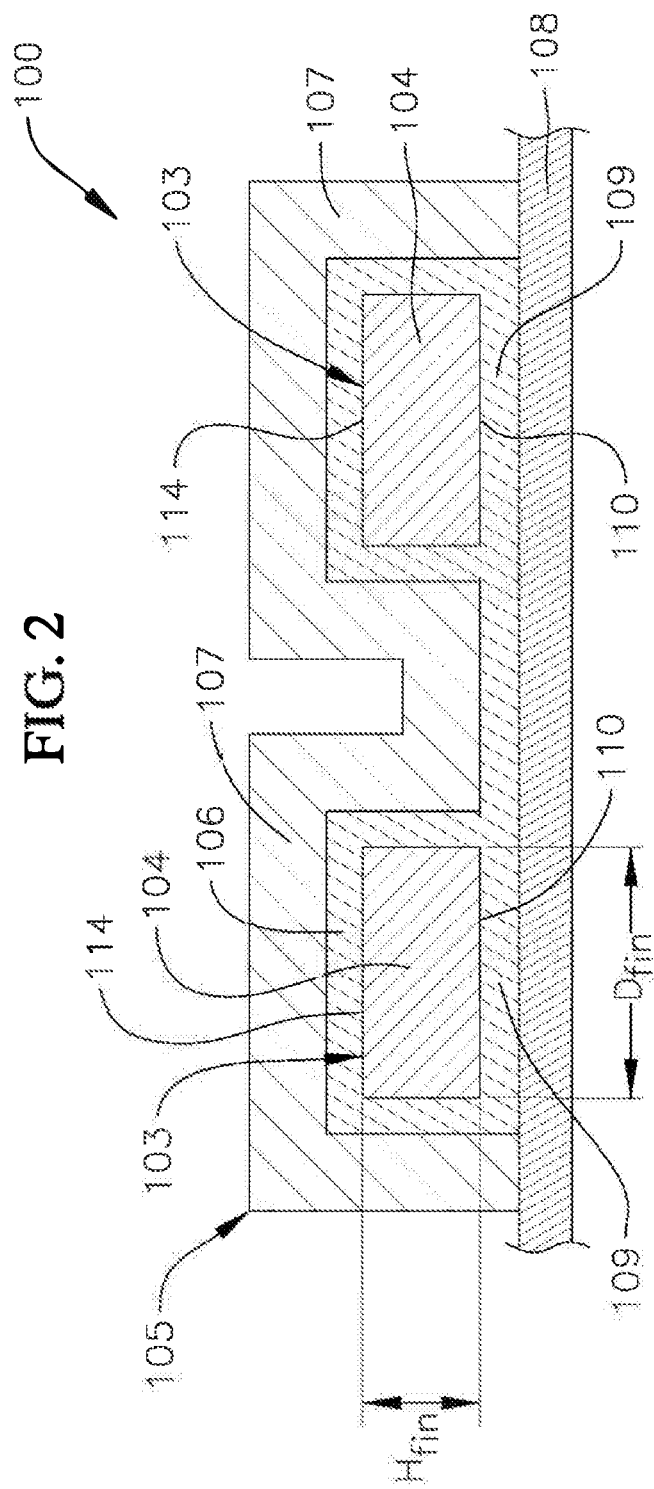
FIG. 2 is a schematic cross-sectional view of a FET according to another embodiment of the present disclosure.

In one or more embodiments, the channel region 104 may have a channel width $D_{fin}$ from approximately 4 nm to approximately 10 nm and a channel height $H_{fin}$ from approximately 20 nm to approximately 80 nm. In one or more embodiments, the channel width $D_{fin}$ of the channel region 104 may be from approximately 4 nm to approximately 7 nm and the channel height $H_{fin}$ may be from approximately 40 nm to approximately 80 nm. In one or more embodiments, the channel width $D_{fin}$ of the channel region 104 may be from approximately 5 nm to approximately 6 nm and the channel height $H_{fin}$ may be from approximately 45 nm to approximately 55 nm. In one or more embodiments, the channel width $D_{fin}$ may be greater than the channel height $H_{fin}$, as illustrated, for example, in the embodiment depicted in FIG. 2. In one or more embodiments, the channel width $D_{fin}$ of the channel region 104 may be from approximately 8 nm to approximately 30 nm and the channel height $H_{fin}$ may be from approximately 5 nm to approximately 20 nm. In one or more embodiments, the channel width $D_{fin}$ of the channel region 104 may be from approximately 15 nm to approximately 30 nm and the channel height $H_{fin}$ may be from approximately 5 nm to approximately 15 nm. In one or more embodiments, the channel height $H_{fin}$ may be at least approximately 15 nm. Since there is only a relatively thin oxide separation layer 109 separating the channel region 104 from the substrate 108, there can be a large capacitive coupling effect dependent on the values of the channel width $D_{fin}$, the channel height $H_{fin}$, and the effective channel length $L_{eff}$ (see FIG. 1A) between the source and drain electrodes 101, 102. The channel width $D_{fin}$, the channel height $H_{fin}$, and the effective channel length $L_{eff}$ may be selected based on the desired substrate bias effect (i.e., capacitive coupling effect). For example, a relatively wider channel width $D_{fin}$, a relatively shorter channel height $H_{fin}$, and a relatively longer effective channel length $L_{eff}$ may be selected to increase the substrate bias effect (i.e., the capacitive coupling effect from the substrate 108 to the channel region 104) to cause a $V_t$ shift of the FET 100 (e.g., to more substantially turn off the FET 100 to achieve a lower-leakage state). For some technological applications, a relatively wider channel width $D_{fin}$, a relatively shorter channel height $H_{fin}$, and a relatively longer effective channel length $L_{eff}$ are desired, in which case the substrate bias effect may be used advantageously to provide for a lower-leakage state for only moderate substrate bias (reverse bias), but without causing large reverse-bias leakage current associated with a substrate-drain junction. Additionally, the increased substrate bias effect can be used to cause a $V_t$ shift of the FET 100 to more substantially turn on the FET 100 to achieve a higher-on-current state, if desired. For some technological applications, the substrate bias effect may be used advantageously to provide for a higher-on-current state for only moderate substrate bias (forward bias) but without causing large forward-bias leakage current associated with a substrate-source junction. That is, the channel width $D_{fin}$, the channel height $H_{fin}$, and the effective channel length $L_{eff}$ may be selected, as desired, to shift the $V_t$ of the FET 100 to a higher $|V_t|$ value to achieve lower leakage current or to a lower $|V_t|$ value to achieve a higher on-current.

In one or more embodiments, the gate dielectric layer 106 of the gate stack 105 may be formed of a high-k dielectric material, such as, for example, a material having a K greater than 10 (e.g., $HFO_2$). In one or more embodiments, the channel region 104 may be formed of Si, SiGe, Ge, or a group III-V material, such as indium gallium arsenide (InGaAs), indium arsenide (InAs), or indium antimonide (InSb).

In the illustrated embodiment, the FET 100 also includes a second fin 103 including a second channel region 104 adjacent to the first fin 103 including the first channel region 104. In the illustrated embodiment, the gate stack 105 (i.e., the gate dielectric layer 106 and the metal layer 107) extend around the second fin 103 in the same manner that the gate stack 105 extends around the first fin 103 and the oxide separation layer 109 separates (e.g., decouples) the second channel region 104 of the second fin 103 from the substrate 108 in the same manner that the oxide separation layer 109 separates (e.g., decouples) the first channel region 104 of the first fin 103 from the substrate 108. In one or more embodiments, the FET 100 may include any other suitable number of fins each including at least one conductive channel region.

In one or more embodiments, the FET 100 may include one or more n-type FETs and/or one or more p-type FETs. In one or more embodiments, the channel regions 104 may be formed of silicon (Si), the upper and lower surfaces 114, 110 of the channel regions 104 have a (100) orientation, and the side surfaces 112, 113 of the channel regions 104 have a (110) orientation. In one or more embodiments, the channel regions 104 may be formed of Si, the upper and lower surfaces 114, 110 of the channel regions 104 have a (110) orientation, and the side surfaces 112, 113 of the channel regions 104 have a (110) orientation. In one or more embodiments, the FET 100 includes an n-type FET having a channel region 104 formed of Si, a p-type FET having a channel region 104 formed of silicon germanium (SiGe), the upper and lower surfaces 114, 110 of the channel regions 104 have a (110) orientation or a (100) orientation, and the side surfaces 112, 113 of the channel regions 104 have a (110) orientation. In one or more embodiments in which the FET 100 includes both n-type FETs and p-type FETs, the orientation of the upper and lower surfaces 114, 110 of the channel regions 104 of the n-type FETs may be the same as the orientation of the upper and lower surfaces 114, 110 of the channel regions 104 of the p-type FETs. In one or more embodiments in which the FET 100 includes both n-type FETs and p-type FETs, the channel regions 104 of both the n-type FETs and the p-type FETs may be formed of Si, the upper and lower surfaces 114, 110 of the channel regions 104 of the n-type FET may have a (100) orientation, and the upper and lower surfaces 114, 110 of the channel regions 104 of the p-type FET may have a (110) orientation. In one or more embodiments in which the FET 100 includes both n-type FETs and p-type FETs, the channel regions 104 of both the n-type FETs and the p-type FETs may be formed of Ge, the upper and lower surfaces 114, 110 of the channel regions 104 of the n-type FETs may have a (111) orientation, and the upper and lower surfaces 114, 110 of the channel regions 104 of the p-type FETs may have a (110) orientation. In one or more embodiments in which the FET 100 includes both n-type FETs and p-type FETs, the channel regions 104 of the n-type FETs may be made from Si, Ge, SiGe, or a group III-V material, the channel regions 104 of the p-type FETs may be made of Si, Ge, or SiGe, and the surface orientation of upper and lower surfaces 114, 110 of the channel regions 104 of the n-type or p-type FETs may be Si (110), Ge (110) n-type Si FET (100), p-type Si FET (110), n-type Ge FET (111), or p-type Ge FET (110).

Figure 3A:
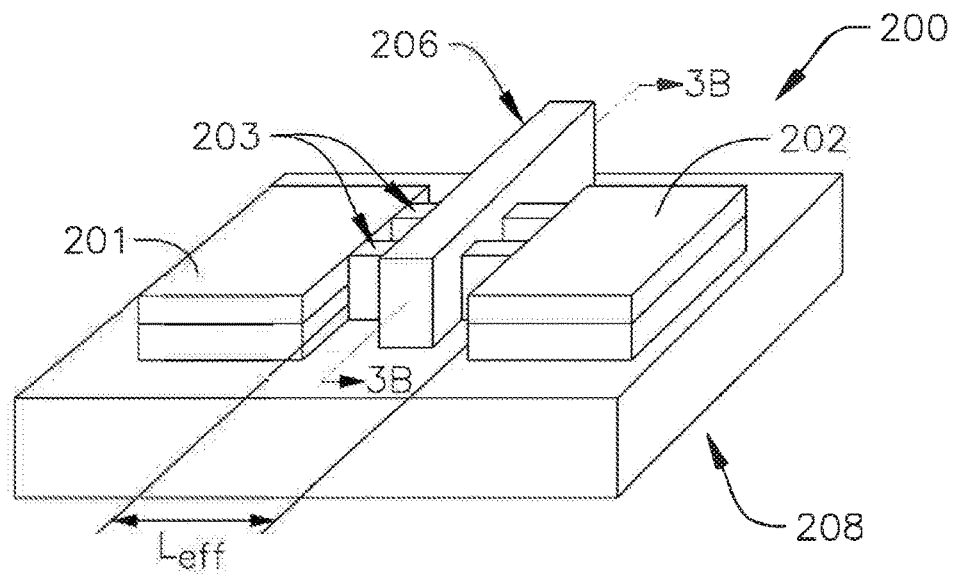
FIGS. 3A-3B are a schematic perspective view and a schematic cross-sectional view, respectively, of a FET according to another embodiment of the present disclosure.
Figure 3B:
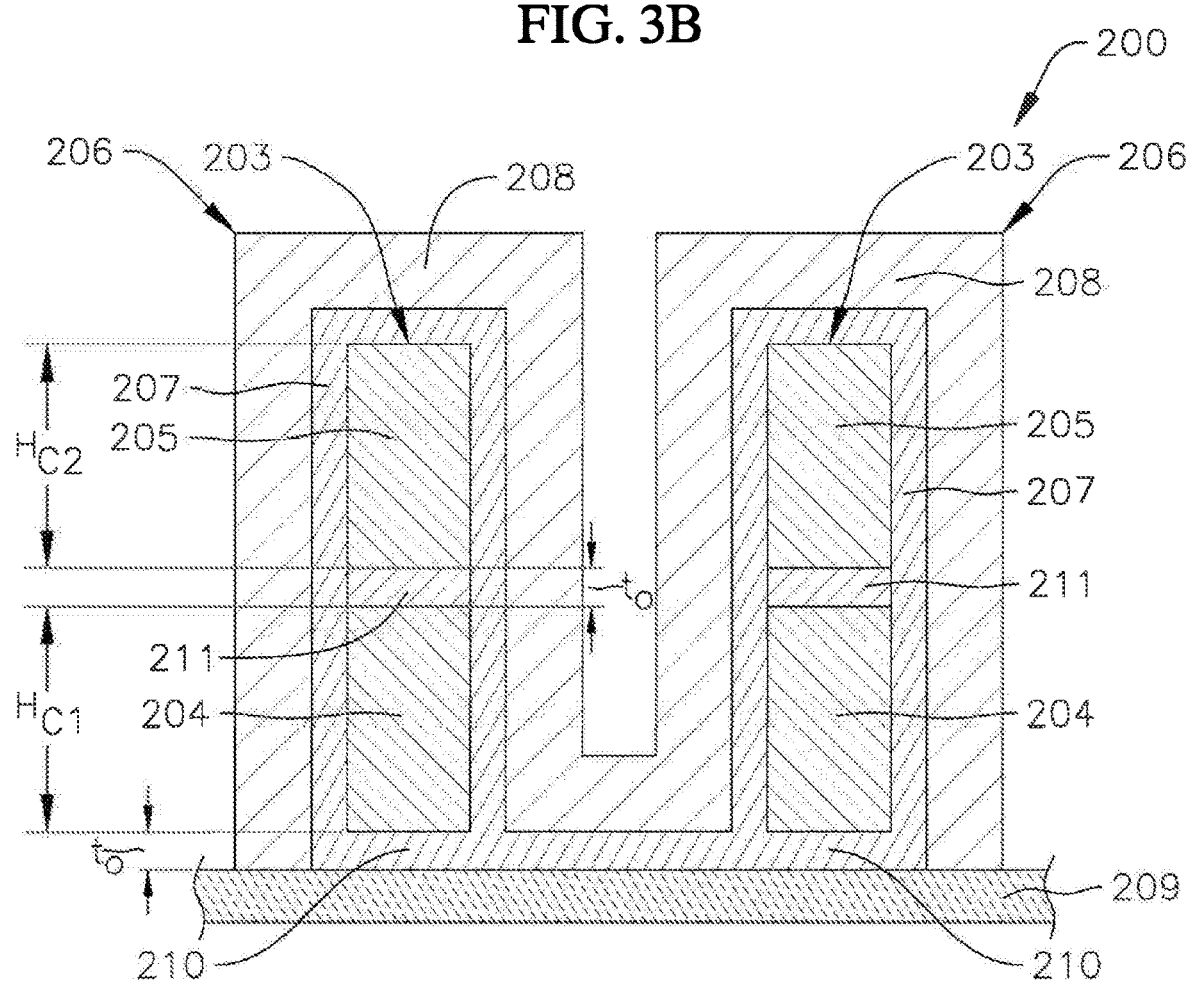

Although in the embodiment illustrated in FIGS. 1A-1B, each of the fins 103 includes a single channel region 104, in one or more embodiments each of the fins 103 may include two or more channel regions (e.g., each of the fins 103 may be divided or separated into a stack of discrete channel regions). For instance, with reference now to FIGS. 3A-3B, a field effect transducer (FET) 200 according to another embodiment of the present disclosure includes a source electrode 201, a drain electrode 202, at least one fin 203 divided or separated into a stack of channel regions 204, 205 extending between the source and drain electrodes 201, 202, and a gate stack 206 including a gate dielectric layer 207 and a metal layer 208 on the gate dielectric layer 207. The source and drain electrodes 202, 202, the fin 203, and the gate stack 206 are formed on a substrate 209 (e.g., a bulk-silicon substrate or a silicon-on-insulator (SOI) substrate). In the illustrated embodiment, the stack includes a first channel region 204 (e.g., a lower channel region) and a second channel region 205 (e.g., an upper channel region).

Additionally, in the illustrated embodiment, the FET 200 includes a first oxide separation layer 210 separating (e.g., decoupling) the first channel region 204 from the substrate 209 and a second oxide separation layer 211 separating the second channel region 205 from the first channel region 204. Although in the illustrated embodiment the stack includes two channel regions 204, 205, in one or more embodiments, stack may include any other suitable number of channel regions 204, 205, such as three or four stacked channel regions, and a corresponding number of oxide separation layers separating adjacent channel regions.

In one or more embodiments, the height $H_{C1}$, $H_{C2}$ of each of the channel regions 204, 205, respectively, is greater than the thickness $t_O$ of the oxide separation layers 210, 211. For instance, in one or more embodiments, the height $H_{C1}$, $H_{C2}$ of each of the channel regions 204, 205 may be from approximately 3 times to approximately 10 times the thickness $t_O$ of the oxide separation layers 210, 211. Additionally, in one or more embodiments, the height $H_{C1}$ of the first channel region 204 may be the same or substantially the same as the height $H_{C2}$ of the second channel region 205, although in one or more embodiments, the height $H_{C1}$ of the first channel region 204 may be different than the height $H_{C2}$ of the second channel region 205 (e.g., the heights of the two or more channel regions may be identical or may include two or more different channel heights).

By providing only a single oxide separation layer 109 (see FIGS. 1A-1B and FIG. 2) or providing two or more oxide separation layers 210, 211 sufficiently spaced apart by the channel regions 204, 205 having sufficient heights (e.g., channel heights of at least approximately 15 nm) (see FIG. 3B), the one or more oxide separation layers are configured to increase the effective strain in the one or more channel regions without substantially reducing the total (summed) height of the vertical sidewalls of the channel regions (i.e., the conducting surfaces of the FET) compared to a conventional finFET of the same total structural height without the oxide separation layers. By providing the one or more oxide separation regions such that the total (summed) height of the conducting sidewalls is not substantially reduced, the FETs of the present disclosure are configured to achieve or substantially achieve the same total current drive per total non-normalized structural height of the fin compared to a conventional finFET without the one or more oxide separation layers.

Figure 4F:
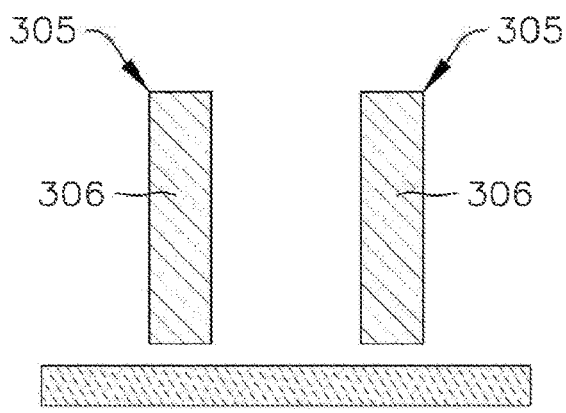
FIGS. 4F-4G depict a schematic cross-sectional view and a schematic top view, respectively, of another task of the method of forming the FET according to one embodiment of the present disclosure.

FIGS. 4A-4K depict tasks of a method of forming a field effect transistor (FET) 300 according to one embodiment of the present disclosure. As illustrated in FIGS. 4A-4B, the method includes a task of layer-by-layer deposition, including depositing a first sacrificial layer 301 directly on a substrate 302 (e.g., a bulk-silicon substrate or a silicon-on-insulator (SOI) substrate), depositing a conducting channel layer 303 on the first sacrificial layer 301, and depositing a second sacrificial layer 304 on the conducting channel layer 303. The substrate 302 may include a (100) or (110) orientation silicon (Si) substrate. In one or more embodiments, the method may not include depositing the second sacrificial layer 304 on the conducting channel layer 303. Additionally, although in the illustrated embodiment the task includes depositing a single conducting channel layer 303 and two sacrificial layers 301, 304, in one or more embodiments, the task may include depositing any other suitable number of conducting channel layers 303 and sacrificial layers 301, 304 separating adjacent conducting channel layers 303 depending on the desired size of the FET and/or the desired number of channel regions for each of the fins of the FET 300 (e.g., the task may include depositing two or more conducting channel layers 303 each separated by a sacrificial layer). In one or more embodiments, the sacrificial layers 301, 304 are formed of SiGe and the conducting channel layer 303 is formed of Si. In one or more embodiments, the SiGe material of the sacrificial layers 301, 304 may include Ge in the range from approximately 10% to approximately 50%, such as from approximately 20% to approximately 30%, or from approximately 15% to approximately 35%. In one or more embodiments in which the first sacrificial layer 301 is formed of SiGe, the first sacrificial layer 301 may be formed by epitaxial deposition of SiGe.

In one or more embodiments, the sacrificial layers 301, 304 each have a thickness from approximately 1 nm to approximately 5 nm (e.g., approximately 2 nm to approximately 3 nm). In one or more embodiments, the channel height $H_{fin}$ of the conducting channel layer 303 may be from approximately 40 nm to approximately 90 nm, from approximately 45 nm to approximately 55 nm (e.g., approximately 50 nm), from approximately 5 nm to approximately 20 nm, or from approximately 5 nm to approximately 15 nm. In one or more embodiments, the conducting channel layer 303 is formed of Si, upper and lower surfaces of the conducting channel layer 303 have a (100) orientation, and sidewalls of the conducting channel layer 303 have a (110)

orientation. In one or more embodiments, the conducting channel layer 303 may be formed of Si, the upper and lower surfaces of the conducting channel layer 303 have a (110) orientation, and the sidewalls of the conducting channel layer 303 have a (110) orientation.

In one or more embodiments in which the FET is an n-type FET, the materials of the conducting channel layer 303 and the sacrificial layers 301, 304 may be Group III-V materials, such as InGaAs and InP, respectively. In one or more embodiments, the materials of the conducting channel layer 303 and the sacrificial layers 301, 304 may be Group IV materials, such as Ge and SiGe, respectively, for either n-type FETs or p-type FETs. In one or more embodiments in which the FET is a p-type FET, the materials of the conducting channel layer 303 and the sacrificial layers 301, 304 may be Group IV materials, such as SiGe and Si, respectively.

In one or more embodiments in which the FET includes both n-type and p-type FETs, the n-type FET has a conducting channel layer 303 formed of Si, the p-type FET has a conducting channel layer 303 formed of SiGe, the upper and lower surfaces of the conducting channel layer 303 have a (110) orientation or a (100) orientation, and the sidewalls of the conducting channel layer 303 have a (110) orientation. In one or more embodiments in which the FET includes both n-type FETs and p-type FETs, the orientation of the upper and lower surfaces of the conducting channel layer 303 of the n-type FETs may be the same as the orientation of the upper and lower surfaces of the conducting channel layer 303 of the p-type FETs. In one or more embodiments in which the FET includes both n-type FETs and p-type FETs, the conducting channel layers 303 of both the n-type FETs and the p-type FETs may be formed of Si, the upper and lower surfaces of the conducting channel layer 303 of the n-type FET may have a (100) orientation, and the upper and lower surfaces of the conducting channel layer 303 of the p-type FET may have a (110) orientation. In one or more embodiments in which the FET includes both n-type FETs and p-type FETs, the conducting channel layers 303 of both the n-type FETs and the p-type FETs may be formed of Ge, the upper and lower surfaces of the conducting channel layer 303 of the n-type FET may have a (111) orientation, and the upper and lower surfaces of the conducting channel layer 303 of the p-type FET may have a (110) orientation. In one or more embodiments in which the FET includes both n-type FETs and p-type FETs, the conducting channel layers 303 of the n-type FETs may be made from Si, Ge, SiGe, or a group III-V material, the conducting channel layers 303 of the p-type FETs may be made of Si, Ge, or SiGe, and the surface orientation of upper and lower surfaces of the conducting channel layers 303 of the n-type or p-type FETs may be Si (110), Ge (110) n-type Si FET (100), p-type Si FET (110), n-type Ge FET (111), or p-type Ge FET (110).

With reference now to FIGS. 4C-4D, the method according to one embodiment of the present disclosure includes a task of patterning and etching the stack of the conducting channel layer 303 and sacrificial layers 301, 304 to form at least one fin 305. The task of patterning and etching the stack of the conducting channel layer 303 and the sacrificial layers 301, 304 may be performed by any suitable process or technique, such as, for instance, lithography, sidewall-image transfer, or dry etching. In the illustrated embodiment, the task includes forming two adjacent fins 305, although in one or more embodiments, the task may include forming any other desired number of fins 305, such as one fin or three or more fins. As illustrated in FIG. 4C, each of the fins 305 includes a channel region 306 formed from the material of the conducting channel layers 303. The task of patterning and etching the stack includes forming the one or more fins 305 with the desired channel height $H_{fin}$, the desired channel width $D_{fin}$ and, in the case of two or more fins 305, forming the fins 305 with the desired horizontal separation distance D between adjacent fins 305. In one or more embodiments, the task may include forming the one or more fins 305 with a channel width $D_{fin}$ from approximately 4 nm to approximately 10 nm, such as from approximately 4 nm to approximately 7 nm or from approximately 5 nm to approximately 6 nm. In one or more embodiments, the task may include forming the one or more fins 305 with a channel width $D_{fin}$ from approximately 8 nm to approximately 30 nm, such as from approximately 5 nm to approximately 20 nm or from approximately 15 nm to approximately 30 nm. The channel width $D_{fin}$ of the one or more fins 305 may vary depending on the type of device into which the FET is designed to be incorporated. In one or more embodiments, the task of forming the one or more fins 305 may include a single mask task and a single etch task or two or more mask and etch tasks. Additionally, in one or more embodiments, the task may include an etch (e.g., a dry etch) that is not selective to either the channel layer material or the sacrificial layer material. Furthermore, the task may be utilized to form one or more fins 305 for nFETs and pFETs.

With continued reference to FIG. 4D, the method also includes a task of forming a dummy gate 307 (e.g., a dummy gate formed of oxide/poly-Si/nitride) and forming an external sidewall spacer 308 by any process known in the art, such as nitride deposition.

The method also includes a task of masking source and drain regions and etching the one or more fins 305 in regions not protected by the dummy gate 307 and the external sidewall spacer 308 formed during the task described above with reference to FIGS. 4C-4D. In one or more embodiments, the etching of the one or more fins 305 proceeds all the way down to, or into, the substrate 302.

With reference now to FIG. 4E, the method also includes a task of forming source and drain regions 309, 310 (e.g., nFET source and drain regions or pFET source and drains) by, for example, epitaxial deposition. In one or more embodiments, the source and drain regions 309, 310 may be nFET source and drain regions formed from any suitable material, such as Si, SiP, or SiCP. In one or more embodiments, the nFET source and drain regions 309, 310 may be formed of Si having impurities, such as phosphorous (P) or carbon (C), such as SiP, SiCP, and/or $Si_3P_4$. During the task of epitaxial deposition, the source and drain regions 309, 310 will form from a bottom and along sidewalls of the etched region, thereby connecting the source and drain regions 309, 310 to the channel region 306 and the sacrificial layers 301, 304. Additionally, in one or more embodiments, during the task of epitaxial deposition, the nFET source and drain regions 309, 310 grow from the silicon substrate 302 to enable strain in the channel region 306.

The method also includes a task of removing the masking of the source and drain regions 309, 310 (i.e., unmasking the source and drain regions 309, 310).

In one or more embodiments, the task of forming the source and drain regions 309, 310 may include a task of forming pFET source and drain regions by, for example, epitaxial deposition. In one or more embodiments, the task of forming the pFET source and drain regions 309, 310 includes depositing a buffer layer of Si having a thickness, for example, from approximately 1 nm to approximately 5 nm (e.g., approximately 1 nm), followed by depositing a layer of SiGe, SiGeB, or a similar material. In one or more embodiments, the task may include depositing a SiGe layer having impurities, such as boron (B) or tin (Sn). In one or more embodiments, a portion of the buffer layer adjacent to the sacrificial layers 301, 304 may be formed from SiGe. In one or more embodiments, a portion of the SiGe of the pFET source and drain regions 309, 310 adjacent to the SiGe sacrificial layers 301, 304 may have the same or different concentration of Ge as the SiGe sacrificial layers 301, 304. In one or more embodiments in which the sacrificial layers 301, 304 are formed of Si, the task of forming the pFET source and drain regions 309, 310 may not include depositing the buffer layer of Si, although in one or more embodiments, the task of forming the pFET source and drain regions 309, 310 may include depositing the buffer layer of Si even when the sacrificial layers 301, 304 are formed of Si. During the task of epitaxial deposition, the pFET source and drain regions 309, 310 will form from a bottom and along sidewalls of the etched region, thereby connecting the source and drain regions 309, 310 to the channel region 306 and the sacrificial layers 301, 304. Additionally, in one or more embodiments, during the task of epitaxial deposition, the pFET source and drain regions 309, 310 grow from the substrate 302 to enable strain in the channel region 306.

Figure 4G:
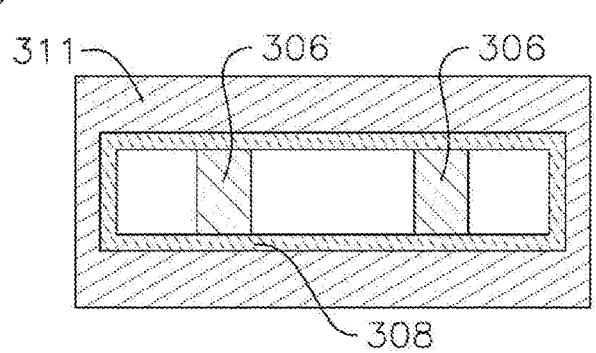
Figure 4H:
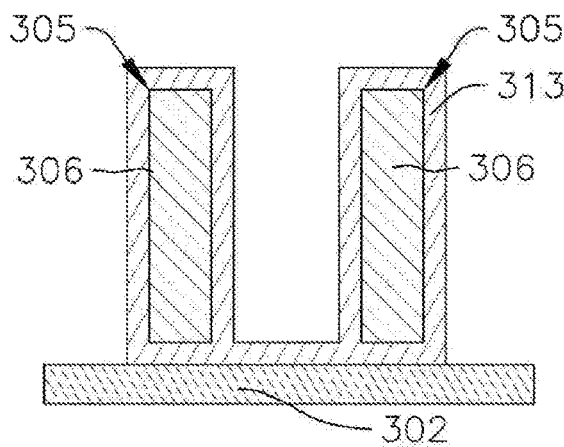
FIGS. 4H-4I depict a schematic cross-sectional view and a schematic top view, respectively, of another task of the method of forming the FET according to one embodiment of the present disclosure.
Figure 4I:
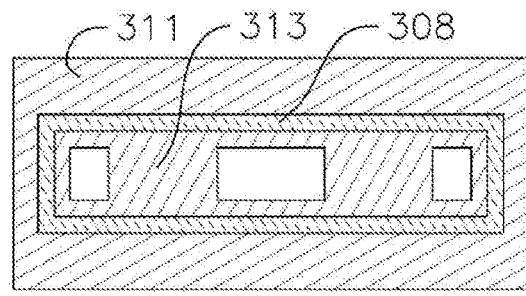
Figure 4J:
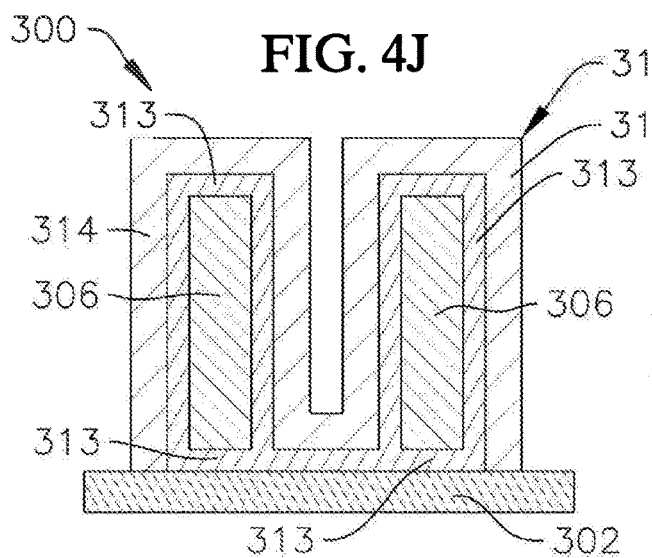
FIGS. 4J-4K depict a schematic cross-sectional view and a schematic top view, respectively, of a further task of the method of forming the FET according to one embodiment of the present disclosure.
Figure 4K:
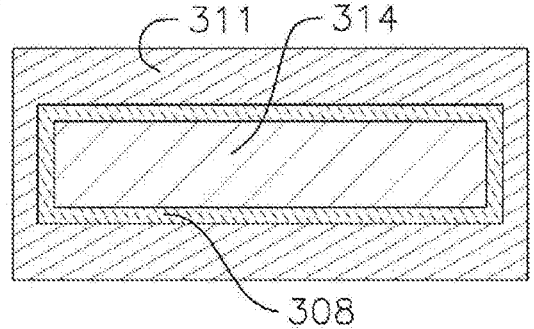

With reference now to FIGS. 4F-4G, the method also includes tasks of depositing an interlayer dielectric (ILD) 311, performing chemical mechanical planarization (CMP) to a top of the dummy gate 307, and then removing the dummy gate 307 to expose the one or more fins 305. With continued reference to FIGS. 4F-4G, the method also includes a task of removing the SiGe sacrificial layers 301, 304 by wet or dry etch that is selective with respect to Si, including selective with respect to the Si channel region 306. The selective etching of the sacrificial layers 301, 304 will not etch into the pFET or nFET source and drain regions 309, 310 because these regions include an Si material adjacent to the sacrificial layers 301, 304. In one or more embodiments, the method may include partially removing the sacrificial layers 301, 304 prior to a subsequent task, described below, of forming a gate stack 312.

With reference now to FIGS. 4H-4K, the method also includes forming the gate stack 312 by forming a gate dielectric layer 313 (see FIGS. 4H-4I) and then forming a metal layer 314 (FIGS. 4J-4K) on the gate dielectric layer 313 by any process or processes known in the art, such as atomic-layer deposition (ALD). During the task of forming the gate stack 312, the gate dielectric layer 313, or a portion of the gate dielectric layer 313, fills the regions of the removed sacrificial layers 301, 304 (i.e., the gate dielectric layer 313, or a portion of the gate dielectric layer 313, fills the regions previously occupied by the sacrificial layers 301, 304). The gate dielectric layer 313 also forms over each of the one or more fins 305 (i.e., the gate dielectric layer 313 forms along the sides of the channel region 306 and along an upper surface of the channel region 306, or along an upper surface of the uppermost channel region 306 when two or more channel regions are present, in each fin 305). Accordingly, following the task of forming the gate stack 312, each of the fins 305 includes a channel region 306 separated (e.g., decoupled) from the substrate 302 by a portion of the gate dielectric layer 313 (e.g., the channel region 306 of each fin 305 is separated (decoupled) from the substrate 302 by an oxide separation layer or region that is a portion of the gate dielectric layer 313). Additionally, during the task of forming the gate stack 312, the metal layer 314 forms uniformly or substantially uniformly on the gate dielectric layer 313 and around each of the one or more fins 305 such that the metal layer 314 extends along the portions of the gate dielectric layer 313 that extend along the sidewalls of the channel region 306 and along a portion of the gate dielectric layer 313 that extends along the upper surface of the channel region 306 of each fin 305. Since the gate dielectric layer 313, or a portion of the gate dielectric layer 313, fills the regions of the removed sacrificial layers 301, 304, the metal layer 314 of the gate stack 312 does not deposit into the regions of the removed sacrificial layers 301, 304. Accordingly, following the task of forming the gate stack 312, the metal layer 314 of the gate stack 312 does not extend between the channel region 306 and the substrate 302 or between adjacent channel regions when two or more channel regions are formed (i.e., unlike the gate dielectric layer 313, the metal layer 314 does not extend along the upper and lower surfaces of each of the channel regions 306).

In one or more embodiments, the gate dielectric layers 313 of the gate stack 312 (including the portion of the gate dielectric layers 313 defining an oxide separation layer decoupling the channel region 306 from the substrate 302) extend to a lateral extent under the external sidewall spacer 308 to reduce metal-semiconductor parasitic capacitance. In one or more embodiments, the lateral extent to which the gate dielectric layers 313 extend may be the same as the external sidewall spacer 308.

The method also includes completing formation of the FET 300 and a circuit including one or more of the FETs 300 by tasks known in the art, including CMP tasks to enable gate metal only in the removed dummy gate regions, followed by a task of contact formation, and a task of back-end-of-line (BEOL) formation. Additionally, in one or more embodiments, the method may include forming partial gate-all-around (GAA) FETS, conventional full GAA FETs, and/or conventional finFETs on the same chip/circuit as the FET 300 formed according to the tasks of the present disclosure described above.

Although in the illustrated embodiment the method depicts forming one or more fins 305 each having a single channel region 306, in one or more embodiments the method may include forming one or more fins 305 each having two or more channel regions (e.g., a second channel region stacked on a first channel region). In one or more embodiments, the method may include depositing a stack of alternating sacrificial layers and channel layers 303 on the substrate 302 (e.g., a first sacrificial layer on the substrate, a first channel layer on the first sacrificial layer, a second sacrificial layer on the first channel layer, and a second channel layer on the second sacrificial layer). The number of channel layers 303 and corresponding sacrificial layers may be selected depending on the desired number of channel regions in each fin 305 of the FET 300. Additionally, gaps or spaces between the lowermost channel region 306 and the substrate 302 and between adjacent channel regions 306 will form during the task of removing the sacrificial layers, and these gaps or spaces will be filled in by portions of the gate dielectric layer 313 during the task of forming the gate stack 312. In this manner, the method illustrated in FIGS. 4A-4K and described above may be utilized to form a FET in which each fin includes two or more stacked channel regions and in which two or more oxide separation regions are utilized to separate (e.g., decouple) the lowermost channel region of each fin from the substrate and separate adjacent channel regions in each fin, as illustrated, for instance, in FIGS. 3A-3B.

What is claimed is:

1. A field effect transistor for an nFET and/or a pFET device, comprising:

a substrate;

a fin decoupled from the substrate, the fin comprising at least one decoupled channel region;

a source electrode and a drain electrode on opposite sides of the fin;

a gate stack extending along side surfaces of the at least one decoupled channel region of the fin, the gate stack comprising a gate dielectric layer and a metal layer on the gate dielectric layer; and wherein a portion of the gate dielectric layer separates the at least one decoupled channel region of the fin from the substrate, and wherein the portion of the gate dielectric layer extends completely from a surface of the at least one decoupled channel region facing the substrate to a surface of the substrate facing the at least one decoupled channel region.

2. The field effect transistor of claim 1, wherein the channel region has a channel width from approximately 4 nm to approximately 10 nm, and wherein the channel region has a channel height from approximately 20 nm to approximately 80 nm.

3. The field effect transistor of claim 1, wherein the channel region has a channel width from approximately 4 nm to approximately 7 nm, and wherein the channel region has a channel height from approximately 40 nm to approximately 80 nm.

4. The field effect transistor of claim 1, wherein the channel region has a channel width from approximately 5 nm to approximately 6 nm, and wherein the channel region has a channel height from approximately 45 nm to approximately 55 nm.

5. The field effect transistor of claim 1, wherein the channel region has a channel width from approximately 8 nm to approximately 30 nm, and wherein the channel region has a channel height from approximately 5 nm to approximately 20 nm.

6. The field effect transistor of claim 1, wherein the channel region has a channel width from approximately 15 nm to approximately 30 nm, and wherein the channel region has a channel height from approximately 5 nm to approximately 15 nm.

7. The field effect transistor of claim 1, wherein the portion of the gate dielectric layer has a thickness from approximately 1 nm to approximately 5 nm.

8. The field effect transistor of claim 1, wherein the portion of the gate dielectric layer does not extend under the source electrode or the drain electrode.

9. The field effect transistor of claim 1, wherein the at least one channel region is strained.

10. The field effect transistor of claim 1, wherein the fin comprises a single channel region.

11. A method of forming a field effect transistor for an nFET and/or pFET device, the method comprising:

forming a stack on a substrate, the stack comprising a first sacrificial layer on the substrate and a conducting channel layer on the first sacrificial layer, etching the stack to form at least one fin comprising at least one conducting channel region;

forming a source electrode on a first side of the at least one fin;

forming a drain electrode on a second side of the at least one fin opposite to the first side;

removing a remainder of the first sacrificial layer between the at least one conducting channel region; and forming a gate stack comprising a gate dielectric layer and a metal layer on the gate dielectric layer, wherein the gate stack extends along a pair of sidewalls of the at least one conducting channel region, wherein a portion of the gate dielectric layer separates the at least one conducting channel region of the fin from the substrate, and wherein the portion of the gate dielectric layer extends completely from a surface of the at least one conducting channel region facing the substrate to a surface of the substrate facing the at least one conducting channel region.

12. The method of claim 11, wherein the forming the stack further comprises forming a second sacrificial layer on the conducting channel layer and a second conducting channel layer on the second sacrificial layer.

13. The method of claim 12, wherein the etching the stack forms the at least one fin comprising a first conducting channel region and a second conducting channel region stacked on the first conducting channel region.

14. The method of claim 13, further comprising forming a second oxide separation region, the second oxide separation region extending between the first conducting channel region and the second conducting channel region.

15. The method of claim 11, wherein the portion of the gate dielectric layer has a thickness from approximately 1 nm to approximately 5 nm.

16. The method of claim 11, wherein the forming of the portion of the gate dielectric layer does not form the portion of the gate dielectric layer under the source electrode or the drain electrode.

17. The method of claim 11, wherein the at least one conducting channel region has a channel width from approximately 4 nm to approximately 10 nm, and wherein the at least one conducting channel region has a channel height from approximately 20 nm to approximately 80 nm.

18. The method of claim 11, wherein the at least one conducting channel region has a channel width from approximately 8 nm to approximately 30 nm, and wherein the at least one conducting channel region has a channel height from approximately 5 nm to approximately 20 nm.

19. The method of claim 11, wherein the conducting channel layer comprises Si, the first sacrificial layer comprises SiGe, and wherein Ge content of the SiGe is from approximately 10% to approximately 50%.

20. The method of claim 11, further comprising forming an external spacer on the at least one fin, wherein the portion of the gate dielectric layer extends to a lateral extent under the external spacer.

* * * * *